US008866136B2

(12) United States Patent
Jung et al.

(10) Patent No.: US 8,866,136 B2
(45) Date of Patent: Oct. 21, 2014

(54) TRANSISTOR, METHOD OF MANUFACTURING THE TRANSISTOR AND ELECTRONIC DEVICE INCLUDING THE TRANSISTOR

(75) Inventors: Ji-sim Jung, Incheon (KR); Chang-seung Lee, Yongin-si (KR); Jae-cheol Lee, Suwon-si (KR); Sang-yoon Lee, Seoul (KR); Jang-yeon Kwon, Seongnam-si (KR); Kwang-hee Lee, Suwon-si (KR); Kyoung-seok Son, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 379 days.

(21) Appl. No.: 12/805,379

(22) Filed: Jul. 28, 2010

(65) Prior Publication Data

US 2011/0127518 A1  Jun. 2, 2011

(30) Foreign Application Priority Data

Dec. 2, 2009  (KR) .................. 10-2009-0118451

(51) Int. Cl.
*H01L 29/10* (2006.01)
*H01L 29/786* (2006.01)

(52) U.S. Cl.
CPC ...... *H01L 29/7869* (2013.01); *H01L 29/78606* (2013.01)
USPC ................. 257/43; 257/59; 257/72; 438/38; 438/104

(58) Field of Classification Search
USPC ................ 257/43, 59, 72; 438/38, 104
See application file for complete search history.

(56) References Cited

U.S. PATENT DOCUMENTS

| 6,563,174 | B2 | 5/2003 | Kawasaki et al. | |
|---|---|---|---|---|
| 2002/0132385 | A1* | 9/2002 | Dojo et al. | 438/30 |
| 2004/0119072 | A1 | 6/2004 | Lee et al. | |
| 2004/0235224 | A1 | 11/2004 | Lin et al. | |
| 2006/0244107 | A1 | 11/2006 | Sugihara et al. | |
| 2007/0090357 | A1 | 4/2007 | Tsou et al. | |
| 2008/0197350 | A1* | 8/2008 | Park et al. | 257/43 |
| 2008/0258141 | A1* | 10/2008 | Park et al. | 257/43 |
| 2008/0315200 | A1* | 12/2008 | Kim et al. | 257/57 |
| 2009/0174835 | A1* | 7/2009 | Lee et al. | 349/46 |
| 2010/0025675 | A1* | 2/2010 | Yamazaki et al. | 257/43 |

(Continued)

FOREIGN PATENT DOCUMENTS

| JP | 4-12330 | * | 1/1992 |
|---|---|---|---|
| KR | 10-0334046 | | 4/2002 |

(Continued)

OTHER PUBLICATIONS

Extended Search Report dated Mar. 16, 2011 for corresponding European Patent Application No. EP 10 19 3027.

*Primary Examiner* — A. Sefer (74) *Attorney, Agent, or Firm* — Harness, Dickey & Pierce, P.L.C.

(57) ABSTRACT

Provided are a transistor, a method of manufacturing the transistor, and an electronic device including the transistor. The transistor may include a passivation layer on a channel layer, a source, a drain, and a gate, wherein the component of the passivation layer is varied in a height direction. The passivation layer may have a multi-layer structure including a silicon oxide layer, a silicon oxynitride layer, and a silicon nitride layer sequentially stacked. The channel layer may include an oxide semiconductor.

25 Claims, 7 Drawing Sheets

(56) References Cited

U.S. PATENT DOCUMENTS

| | | | |
|---|---|---|---|
| 2010/0025677 A1* | 2/2010 | Yamazaki et al. | 257/43 |
| 2010/0032668 A1* | 2/2010 | Yamazaki et al. | 257/43 |
| 2010/0035379 A1* | 2/2010 | Miyairi et al. | 438/104 |
| 2010/0090217 A1* | 4/2010 | Akimoto | 257/43 |
| 2010/0096628 A1 | 4/2010 | Song et al. | |
| 2010/0159642 A1* | 6/2010 | Jung et al. | 438/104 |
| 2010/0163862 A1* | 7/2010 | Yang et al. | 257/43 |
| 2010/0283049 A1 | 11/2010 | Sato et al. | |
| 2010/0308333 A1* | 12/2010 | Yoo et al. | 257/59 |
| 2011/0012106 A1* | 1/2011 | Yamazaki et al. | 257/43 |

FOREIGN PATENT DOCUMENTS

| | | |
|---|---|---|
| KR | 10-2004-0060106 | 7/2004 |
| KR | 10-0683142 | 2/2007 |
| KR | 10-0687331 | 2/2007 |
| KR | 10-2007-0109873 | 11/2007 |
| WO | WO 2009/072532 | 6/2009 |

* cited by examiner

TRANSISTOR, METHOD OF MANUFACTURING THE TRANSISTOR AND ELECTRONIC DEVICE INCLUDING THE TRANSISTOR

CROSS-REFERENCE TO RELATED APPLICATIONS

This application claims priority under U.S.C. §119 to Korean Patent Application No. 10-2009-0118451, filed on Dec. 2, 2009, in the Korean Intellectual Property Office (KIPO), the entire contents of which are incorporated herein by reference.

BACKGROUND

1. Field

Example embodiments relate to transistors, methods of manufacturing the transistors, and electronic devices including the transistors.

2. Description of the Related Art

Transistors are widely used as switching devices or driving devices in electronic devices. In particular, because thin film transistors may be formed on glass substrates or plastic substrates, they are generally used in the field of flat display devices, e.g., liquid crystal display devices and/or organic light emitting display devices.

A method of using an oxide layer having higher carrier mobility as a channel layer is attempted to improve operating characteristics of a transistor. This method is mostly applied to a thin film transistor for a flat display device. However, characteristics of a transistor having an oxide layer as a channel layer may not be constantly maintained because the oxide layer is sensitive to environment, e.g., light or moisture.

SUMMARY

Provided are transistors of which characteristic variation due to environment is suppressed, methods of manufacturing the transistors, and electronic devices including the transistors. Additional aspects will be set forth in part in the description which follows and, in part, will be apparent from the description, or may be learned by practice of example embodiments.

According to example embodiments, a transistor may include a source electrode and a drain electrode configured to separately contact both ends of a channel layer, a gate corresponding to the channel layer and a passivation layer on the channel layer, the source and drain electrodes, and the gate, the passivation layer including a silicon oxide layer, a silicon oxynitride layer, and a silicon nitride layer sequentially stacked.

The channel layer may include an oxide, for example, a ZnO-based oxide including indium (In) and at least one of the group consisting of hafnium (Hf), yttrium (Y), tantalum (Ta), zirconium (Zr), titanium (Ti), copper (Cu), nickel (Ni), gallium (Ga), aluminum (Al), tin (Sn), and magnesium (Mg). For example, the ZnO-based oxide may include hafnium indium zinc oxide (HfInZnO).

The silicon oxynitride layer may have a thickness of about 100 nm to about 400 nm. The transistor may further include a gate insulating layer on a substrate and between the channel layer and the gate. The gate insulating layer may be at least one from the group consisting of a silicon oxide layer, a silicon nitride layer and a high-k dielectric material layer having a larger dielectric constant than the silicon nitride layer.

The channel layer may be on the gate, and an etch stop layer may be on the channel layer, wherein the source electrode and the drain electrode are on both ends of the etch stop layer. The gate may also be on the channel layer. A flat display device may include the transistor according to example embodiments.

According to example embodiments, a method of manufacturing a transistor may include preparing a transistor including a channel layer, a source electrode, a drain electrode, and a gate corresponding to the channel layer and forming a passivation layer on the channel layer, wherein forming the passivation layer may include forming a silicon oxide layer on the transistor, forming a silicon oxynitride layer on the silicon oxide layer and forming a silicon nitride layer on the silicon oxynitride layer.

At least one of the silicon oxide layer, the silicon oxynitride layer, and the silicon nitride layer is formed using plasma-enhanced chemical vapor deposition (PECVD). A first reaction gas including ammonia ($NH_3$) as a source gas of nitrogen (N) may be used for forming the silicon oxynitride layer, and a second reaction gas including $NH_3$ as the source gas of N is used for forming the silicon nitride layer, and wherein a flow rate of $NH_3$ of the first reaction gas is lower than a flow rate of $NH_3$ of the second reaction gas.

The silicon oxynitride layer may be formed at a lower pressure than the silicon nitride layer using a lower source power than the silicon nitride layer. The silicon oxynitride layer may be formed to have a thickness of about 100 nm to about 400 nm.

The channel layer may include an oxide, for example, a ZnO-based oxide including indium (In) and at least one of the group consisting of hafnium (Hf), yttrium (Y), tantalum (Ta), zirconium (Zr), titanium (Ti), copper (Cu), nickel (Ni), gallium (Ga), aluminum (Al), tin (Sn), and magnesium (Mg). For example, the ZnO-based oxide may include hafnium indium zinc oxide (HfInZnO).

A gate insulating layer may be formed on a substrate, and the gate insulating layer may be provided between the channel layer and the gate. The gate insulating layer may be at least one from the group consisting of a silicon oxide layer, a silicon nitride layer and a high-k dielectric material layer having a larger dielectric constant than the silicon nitride layer.

The transistor may have at least one of a bottom gate structure and a top gate structure. When the transistor has a bottom gate structure, an etch stop layer may be formed on the channel layer, wherein the source electrode and the drain electrode may be on both ends of the etch stop layer. Prior to forming the passivation layer, the method may further include treating an exposed portion of the channel layer with plasma including oxygen. According to example embodiments a method of manufacturing a flat display device may include the method of manufacturing a transistor of example embodiments.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Various example embodiments will now be described more fully with reference to the accompanying drawings in which example embodiments are shown. Example embodiments may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Reference will now be made in detail to embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description.

Figure 1:
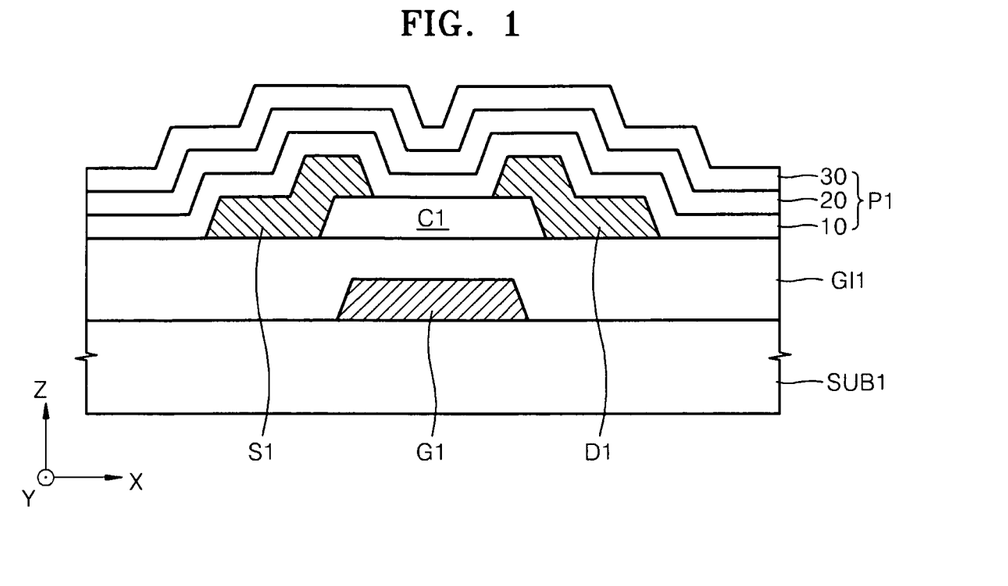
FIGS. 1 through 3 are cross-sectional views of transistors according to example embodiments.

FIG. 1 is a cross-sectional view of a transistor according to example embodiments. The transistor according to example embodiments is a thin film transistor (TFT) having a bottom gate structure in which a gate G1 is formed below a channel layer C1.

Referring to FIG. 1, the gate G1 may be formed on a substrate SUB1. The substrate SUB1 may be a glass substrate or other substrates used in a general semiconductor device process, for example, a plastic or silicon substrate. The gate G1 may be formed of a general electrode material, e.g., a metal and/or a metal oxide. A gate insulating layer GI1 may be formed on the substrate SUB1 to cover the gate G1. The gate insulating layer GI1 may be a silicon oxide layer, a silicon nitride layer, or another material layer, e.g., a high-k dielectric material layer having a larger dielectric constant than the silicon nitride layer. The gate insulating layer GI1 may have a structure in which at least two layers of the group consisting of the silicon oxide layer, the silicon nitride layer, and the high-k dielectric material layer are stacked. For example, the gate insulating layer GI1 may include the silicon nitride layer and the silicon oxide layer, which are sequentially stacked from the gate G1.

A channel layer C1 may be formed on the gate insulating layer GI1. The channel layer C1 may be disposed above the gate G1. The width of the channel layer C1 in the X-axis direction may be greater than the width of the gate G1 in the X-axis direction. The channel layer C1 may include an oxide semiconductor, for example, a ZnO-based oxide semiconductor. When the channel layer C1 includes the ZnO-based oxide semiconductor, the channel layer C1 may further include indium (In), for example. In other words, the channel layer C1 may include an InZnO-based oxide semiconductor. The channel layer C1 may further include a transition metal, e.g., hafnium (Hf), yttrium (Y), tantalum (Ta), zirconium (Zr), titanium (Ti), copper (Cu) and/or nickel (Ni), a Group III element, e.g., gallium (Ga) and/or aluminum (Al), a Group IV element, e.g., tin (Sn), a Group II element, e.g., magnesium (Mg) or other elements. In detail, the channel layer C1 may include hafnium indium zinc oxide (HfInZnO) and/or gallium indium zinc oxide (GaInZnO). However, a material for the channel layer C1 is not limited thereto, and various materials may be used to form the channel layer C1. The channel layer C1 may have a single layer structure or a multi-layer structure.

A source electrode S1 and a drain electrode D1 may be disposed on the gate insulating layer GI1. The source electrode S1 and the drain electrode D1 may contact both ends of the channel C1, respectively. The source electrode S1 and the drain electrode D1 may be a single metal layer or a multi-metal layer. The source electrode S1 and the drain electrode D1 may be the same material layers as the gate G1 or other material layers. A surface of the channel layer C1 that is not covered by the source electrode S1 and the drain electrode D1 may be treated with a plasma including oxygen. Due to plasma treatment, the electrical conductivity of the channel layer C1 may be controlled.

A passivation layer P1 may be formed on the gate insulating layer GI1 to cover the source and drain electrodes S1 and D1 and the channel layer C1. The passivation layer P1 may have a multi-layer structure including a silicon oxide layer 10, a silicon oxynitride layer 20, and a silicon nitride layer 30, which are sequentially stacked on the gate insulating layer GI1. The silicon oxide layer 10 may be formed at a relatively low temperature of about 100° C. to about 250° C. or at a relatively high temperature of about 250° C. to 450° C. When the silicon oxide layer 10 is formed at a high temperature, the silicon oxide layer 10 may have a higher density than a case where the silicon oxide layer 10 is formed at a lower temperature. The silicon oxynitride layer 20 and the silicon nitride layer 30 may be formed at about 100° C. to about 250° C., but may also be formed at a temperature that is higher than or equal to about 250° C. Variations of characteristics of the channel layer C1 due to environment may be suppressed or minimized by the passivation layer P1, and thus, the reliability of the transistor may be improved, which will be described later in more detail.

Thicknesses of the gate G1, the channel layer C1, the gate insulating layer GI1, the source electrode S1, the drain electrode D1, and the passivation layer P1 may be about 50 to about 300 nm, about 40 to about 100 nm, about 50 to about 400 nm, about 10 to about 200 nm, about 10 to about 200 nm, and about 250 to about 1200 nm, respectively. Thicknesses of the silicon oxide layer 10, the silicon oxynitride layer 20, and the silicon nitride layer 30 may be about 50 to about 400 nm, about 100 to about 400 nm, and about 100 to about 400 nm, respectively. However, the thickness ranges may be varied.

Figure 2:
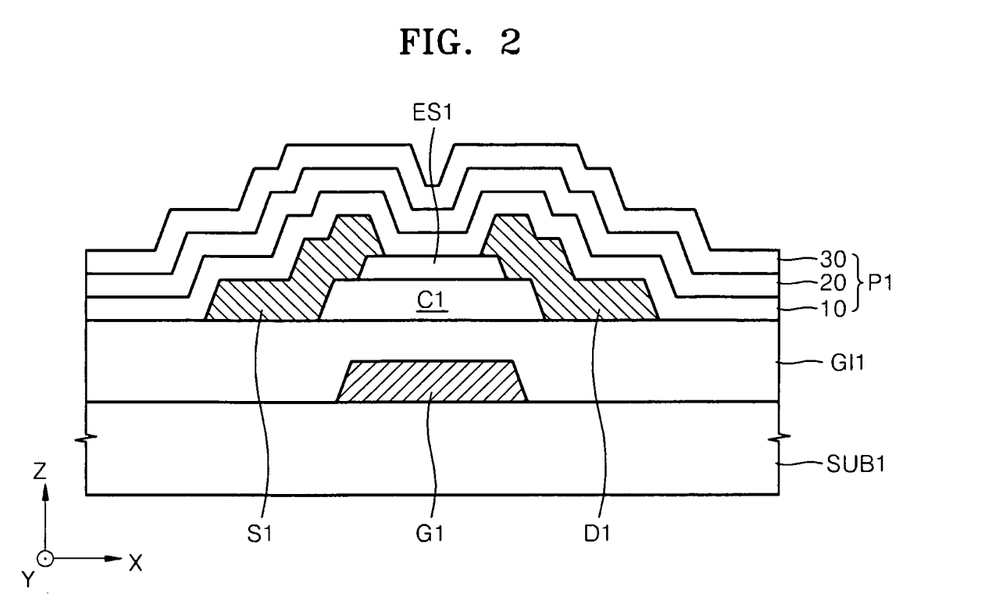

Alternatively, the transistor of FIG. 1 may further include an etch stop layer on the channel layer C1. FIG. 2 is a cross-sectional view of a transistor in which an etch stop layer ES1 is formed on the channel layer C1, according to example embodiments.

Referring to FIG. 2, the etch stop layer ES1 may be formed on the channel layer C1. The width of the etch stop layer ES1 in the X-axis direction may be smaller than the channel layer C1. Both ends of the channel layer C1 may not be covered by the etch stop layer ES1. The source electrode S1 may cover ends of the etch stop layer ES1 and the channel layer C1, and the drain electrode D1 may cover other ends of the etch stop layer ES1 and the channel layer C1.

The etch stop layer ES1 may prevent or reduce damage to the channel layer C1 by an etching process for forming the source electrode S1 and the drain electrode D1. The etch stop layer ES1 may include a silicon oxide, a silicon nitride, and/or an organic insulating material. The use of the etch stop layer ES1 may be determined according to a material for the channel layer C1 and a material for the source electrode S1 and the drain electrode D1. Except for the etch stop layer ES1, the structure of the transistor of FIG. 2 may be the same as that of FIG. 1.

Figure 3:
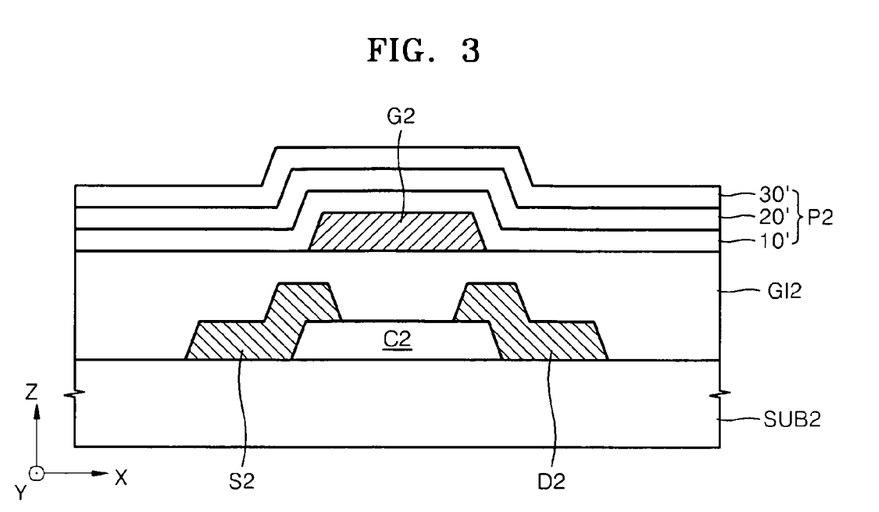

FIG. 3 is a cross-sectional view of a transistor according to example embodiments. The transistor of FIG. 3 is a TFT having a top gate structure in which a gate G2 is formed above a channel layer C2. Referring to FIG. 3, the channel layer C2 may be formed on a substrate SUB2. A source electrode S2 and a drain electrode D2 may be disposed on the substrate SUB2 and may contact both ends of the channel layer C2, respectively. A surface of the channel layer C2 that is not covered by the source electrode S2 and the drain electrode D2 may be treated with a plasma including oxygen. A gate insulating layer GI2 may be formed to cover the channel layer C2, the source electrode S2, and the drain electrode D2. The gate G2 may be formed on the gate insulating layer GI2. The gate G2 may be formed above the channel layer C2.

Materials and thicknesses of the substrate SUB2, the channel layer C2, the source electrode S2, the drain electrode D2, the gate insulating layer GI2, and the gate G2 may be the same as or similar to those of the substrate SUB1, the channel layer C1, the source electrode S1, the drain electrode D1, the gate insulating layer GI1, and the gate G1 of FIG. 1. The channel layer C2 and the gate insulating layer GI2 may have the same stack structure as the channel layer C1 and the gate insulating layer GI1 of FIG. 1 or a reverse structure (e.g., upside-down structure) thereof.

A passivation layer P2 may be formed on the gate insulating layer GI2 to cover the gate G2. The passivation layer P2 may include a silicon oxide layer 10', a silicon oxynitride layer 20', and a silicon nitride layer 30', which are sequentially stacked on the gate insulating layer GI2. The silicon oxide layer 10', the silicon oxynitride layer 20', and the silicon nitride layer 30' may correspond to the silicon oxide layer 10, the silicon oxynitride layer 20, and the silicon nitride layer 30 of FIG. 1, respectively.

Figure 4:
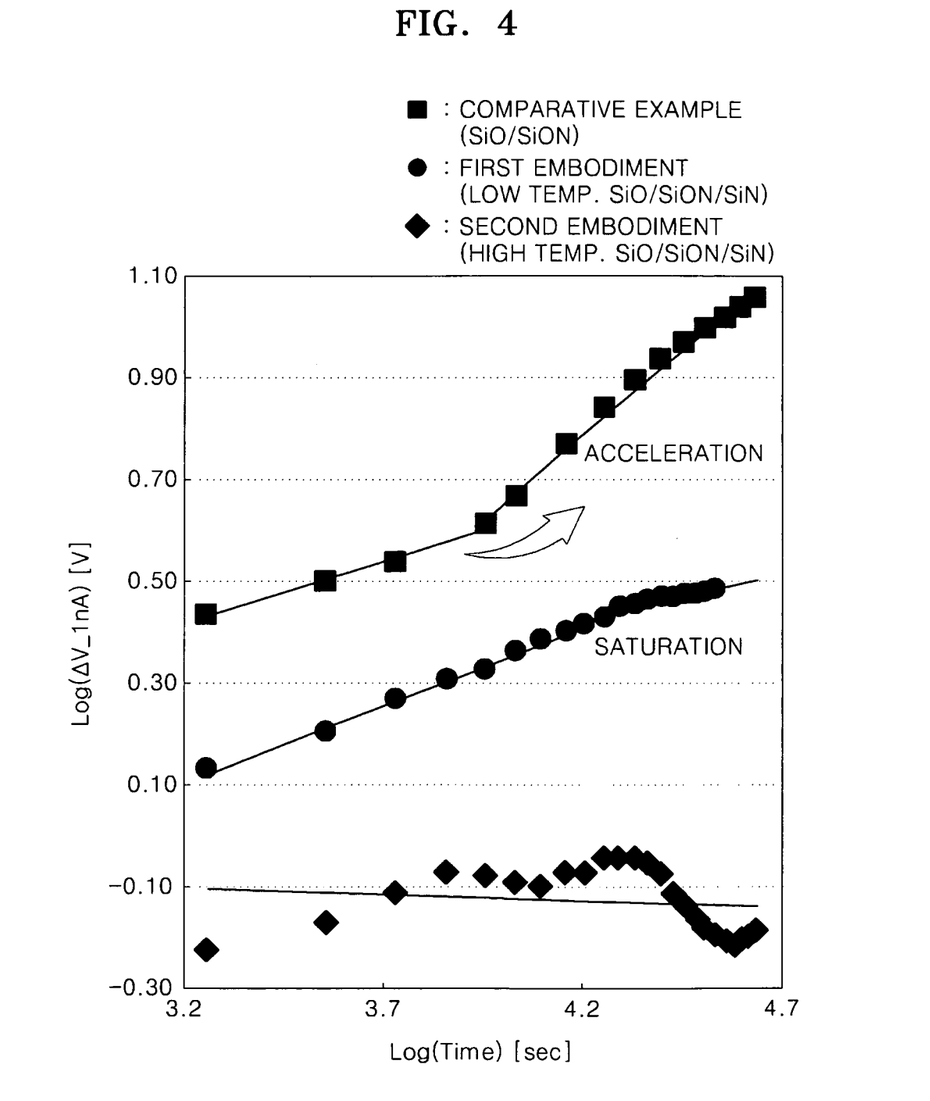
FIG. 4 is a graph showing variations in characteristics of transistors according to a comparative example and example embodiments, due to light irradiation and a voltage stress, wherein the variations are indicated in a log scale.

FIG. 4 is a graph showing variations "ΔV_1nA" in characteristics of a transistor according to a comparative example and example embodiments, due to light irradiation and a voltage stress, wherein the variations are indicated in a log scale. The transistor according to the comparative example uses a double layer in which a silicon oxide layer $SiO_x$ and a silicon oxynitride layer $SiO_xN_y$ are sequentially stacked, as a passivation layer. The other configuration of the transistor according to the comparative example is the same as the transistor of FIG. 2.

Transistors according to example embodiments use a passivation layer having a triple layer structure. The transistors according to example embodiments are the same as the transistor of FIG. 2. A silicon oxide layer (layer 10 of FIG. 2) of the passivation layer according to example embodiments may be formed at a relatively low temperature of about 150° C., and a silicon oxide layer of the passivation layer according to example embodiments may be formed at a higher temperature of about 350° C. In example embodiments, the silicon oxynitride layer (layer 20 of FIG. 2) and the silicon nitride layer (layer 30 of FIG. 2) are formed at a relatively low temperature of about 150° C. Hereinafter, the passivation layer according to example embodiments is referred to as a "low temperature triple layer" and the passivation layer according to example embodiments is referred to as a "high temperature triple layer". The transistors according to the comparative example and example embodiments use an HfInZnO layer as a channel layer.

Light of about 20,000 nit was irradiated on the transistors according to the comparative example and example embodiments in an air atmosphere, and voltages, e.g., −20 V, 10 V, and 0 V, were applied to a gate, a drain electrode, and a source electrode, respectively, and thus, variations "$\Delta V\_1nA$" in characteristics of each of the transistors according to time were measured. "$\Delta V\_1nA$" is a difference in '$V\_1nA$' before and after light irradiation, e.g., [$V\_1nA$(after)−$V\_1nA$(before)]. "$V\_1nA$" represents a gate voltage that allows current of 1 nA to flow between the source and drain electrodes. When measuring "$V\_1nA$", 10 V and 0 V were applied to the drain and source electrodes, respectively. As variations in "$V\_1nA$" increase, variations in the characteristics of the transistors due to light are larger.

Referring to FIG. 4, in the transistor according to the comparative example, "$\Delta V\_1nA$" is the largest and increases according to time, and variations in "$\Delta V\_1nA$" are accelerated from a time at which "log(time)" is about 4.0. This indicates that, in the transistor according to the comparative example, variations in characteristics of the transistor under a voltage stress due to light is relatively large, and as time goes by, the variations increase. Because the passivation layer (a double layer $SiO_x/SiO_xN_y$) according to the comparative example does not protect the transistor from the environment, e.g., moisture, the characteristics of the transistor are easily varied. In the transistor according to example embodiments, "$\Delta V\_1nA$" is relatively smaller than the transistor according to the comparative example. Also, as time goes by, "$\Delta V\_1nA$" increases and is saturated. In other words, when the "low temperature triple layer" is used as the passivation layer, the variations in the characteristics of the transistor may be suppressed. The "low temperature triple layer" may efficiently prevent or reduce penetration of moisture so that the variations in the characteristics of the transistor are suppressed. In the transistor according to example embodiments, effects of environment on the variations in the characteristics of the transistor may be prevented or reduced so that there are almost no variations of "$\Delta V\_1nA$" according to time. This indicates that the photoelectric reliability of the transistor is improved when the "high temperature triple layer" is used as the passivation layer.

Figure 5:
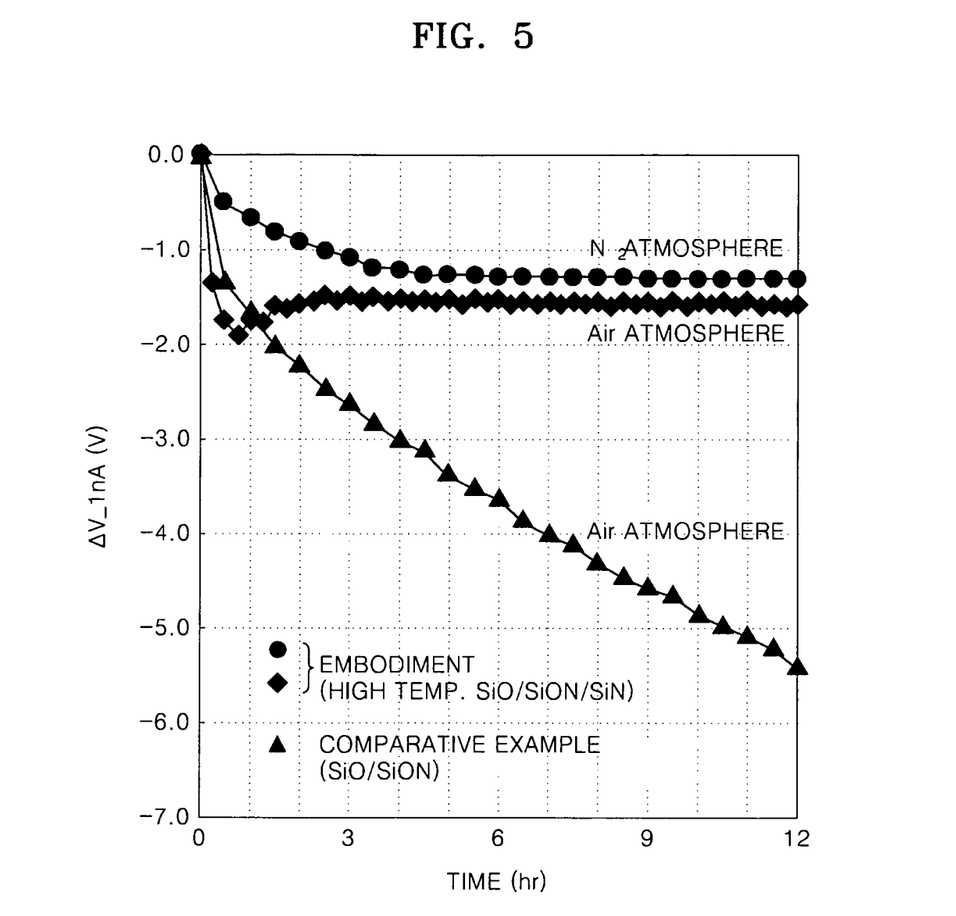
FIG. 5 is a graph showing variations in characteristics of transistors according to a comparative example and example embodiments, due to light irradiation and a voltage stress.

FIG. 5 is a graph showing variations "$\Delta V\_1nA$" in characteristics of transistors according to a comparative example and example embodiments, due to light irradiation and a voltage stress. The transistor according to example embodiments is the same as the transistor according to example embodiments of FIG. 4 (e.g., a structure in which the "high temperature triple layer" is used as the passivation layer), and the transistor according to the comparative example is the same as the transistor according to the comparative example of FIG. 4 (e.g., a structure in which the double layer $SiO_x/SiO_xN_y$ is used as the passivation layer). Conditions of light irradiation and a voltage stress are the same as those of FIG. 4. In the transistor according to example embodiments, measurement was performed in an air atmosphere and a nitrogen ($N_2$) atmosphere, and in the transistor according to the comparative example, measurements were performed in the air atmosphere.

Referring to FIG. 5, in the transistor according to the comparative example, e.g., in the transistor in which the double layer including the silicon oxide layer ($SiO_x$) and the silicon oxynitride layer ($SiO_xN_y$) sequentially stacked is used as the passivation layer, as times goes by, "$\Delta V\_1nA$" is varied (decreases). The photoelectric reliability of the transistor according to the comparative example is not desirable.

On the other hand, in the transistor according to example embodiments, e.g., in the transistor in which the "high temperature triple layer" is used as the passivation layer, the variations "$\Delta V\_1nA$" are relatively small and are nearly constantly maintained after a predetermined or given amount of time. In the transistor according to example embodiments, results of measuring performed in the air atmosphere and the nitrogen ($N_2$) atmosphere are nearly similar to each other. The nitrogen ($N_2$) atmosphere is a non-reactive gas atmosphere in which humidity is 0%. Thus, the fact that the results of measuring performed in the air atmosphere and the nitrogen ($N_2$) atmosphere are nearly similar to each other indicates that the "high temperature triple layer" used as the passivation layer in FIG. 5 may prevent or reduce effects due to the environment, e.g, moisture in the air, nearly completely.

As such, the passivation layer including the silicon oxide layer, the silicon oxynitride layer, and the silicon nitride layer, which are sequentially formed from the channel layer, is used so that effects of environment on the transistor (in particular, oxide transistor) may be minimized or reduced and the reliability of the transistor may be improved.

When forming a passivation layer, a silicon nitride layer may be deposited directly on a silicon oxide layer. However, in example embodiments, problems may occur in fundamental switching characteristics of the transistor. When the silicon nitride layer is deposited, plasma and/or hydrogen may penetrate a channel layer via the silicon oxide layer so that characteristics of the channel layer may be deteriorated. Because the silicon oxide layer generally has porosity, penetration of plasma and/or hydrogen may not be prevented or reduced.

Thus, example embodiments may use the passivation layer having the triple layer structure in which the silicon oxide layer, the silicon oxynitride layer, and the silicon nitride layer are sequentially stacked. In example embodiments, the silicon oxynitride layer is used as a buffer layer (or a blocking layer), and when the silicon nitride layer is formed, penetration of plasma and/or hydrogen may be prevented or suppressed. Considering the function of the silicon oxynitride layer as the buffer layer (or the blocking layer), the thickness of the silicon oxynitride layer may be at least about 100 nm. However, as occasions demand, the minimal thickness of the silicon oxynitride layer may be varied.

Figure 6A:
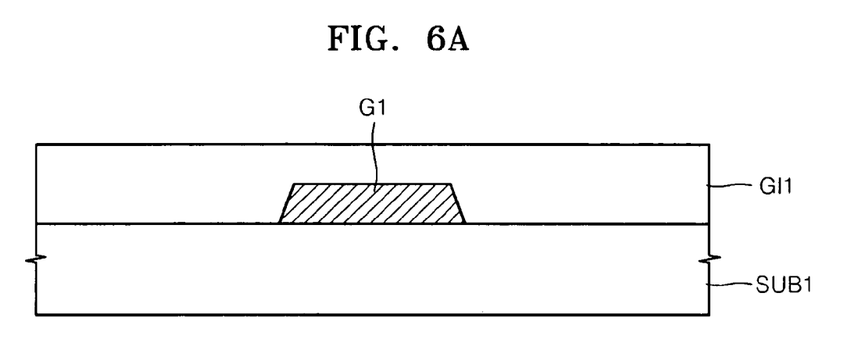
FIGS. 6A through 6C are cross-sectional views of a method of manufacturing a transistor, according to example embodiments.
Figure 6B:
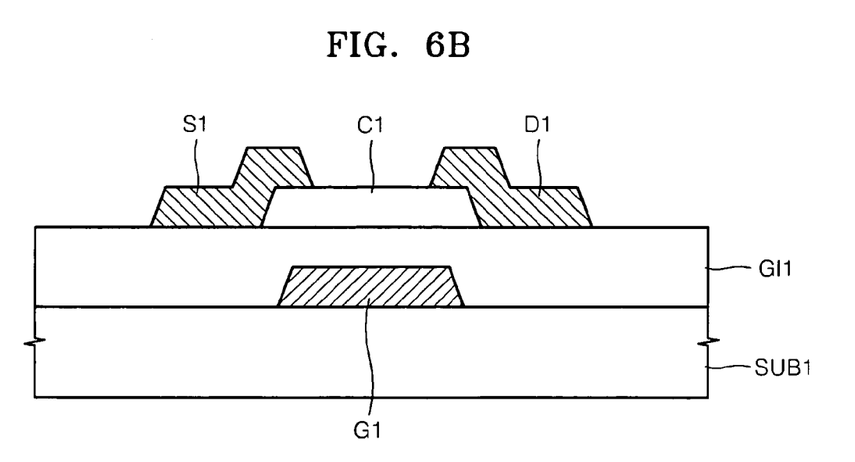
Figure 6C:
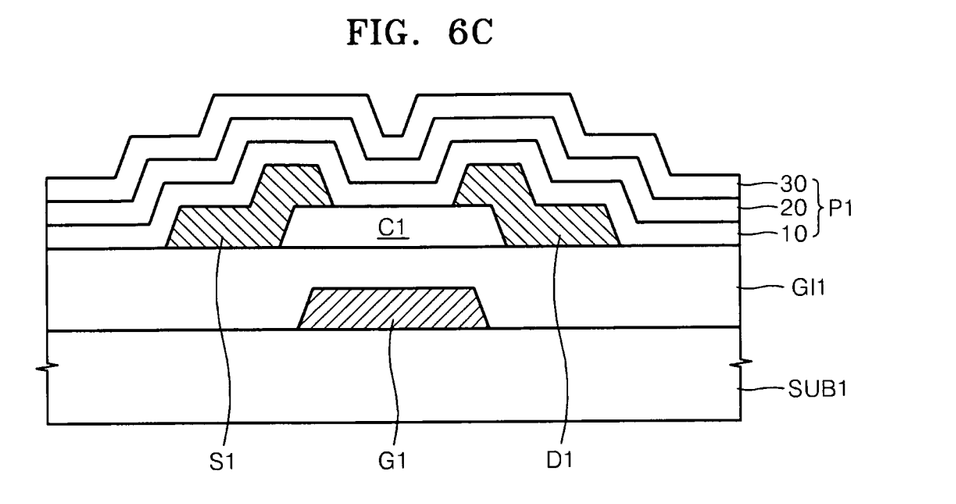

Hereinafter, methods of manufacturing transistors according to example embodiments will be described with reference to FIGS. 6A through 6C and FIGS. 7A through 7C. FIGS. 6A through 6C are cross-sectional views of a method of manufacturing a transistor, according to example embodiments. In example embodiments, a thin film transistor (TFT) having a bottom gate structure is manufactured. In FIG. 1 and FIGS. 6A through 6C, like reference numerals denote like elements.

Referring to FIG. 6A, a gate G1 may be formed on a substrate SUB1, and a gate insulating layer GI1 covering the gate G1 may be formed. The substrate SUB1 may be a glass substrate or other substrates used in a conventional semiconductor device process, for example, a plastic or silicon substrate. The gate G1 may be formed of a general electrode material, e.g., a metal and/or a metal oxide. The gate insulating layer GI1 may be a silicon oxide layer, a silicon nitride layer, or another material layer, e.g., a high-k dielectric material layer, having a larger dielectric constant than the silicon nitride layer. The gate insulating layer GI1 may have a structure in which at least two layers of the group consisting of the silicon oxide layer, the silicon nitride layer, and the high-k dielectric material layer are stacked. For example, the gate insulating layer GI1 may include the silicon nitride layer and the silicon oxide layer, which are sequentially stacked from the gate G1.

Referring to FIG. 6B, a channel layer C1 may be formed on the gate insulating layer GI1. The channel layer C1 may be formed by using a physical vapour deposition (PVD) method, e.g., sputtering, evaporation or other methods. The channel layer C1 may be formed of an oxide semiconductor, for example, a ZnO-based oxide semiconductor. The ZnO-based oxide semiconductor may further include In. In other words, the channel layer C1 may be formed of an InZnO-based oxide semiconductor. The ZnO-based oxide semiconductor or the InZnO-based oxide semiconductor may further include a transition metal, e.g., Hf, Y, Ta, Zr, Ti, Cu and/or Ni, a Group III element, e.g., Ga and/or Al, a Group IV element, e.g., Sn, a Group II element, e.g., Mg, or other elements. In detail, in example embodiments, the channel layer C1 may be formed of HfInZnO and/or GaInZnO. The channel layer C1 may have a single layer structure or a multi-layer structure.

A source electrode S1 and a drain electrode D1 may be disposed on the gate insulating layer GI1. The source electrode S1 and the drain electrode D1 may contact both ends of the channel layer C1, respectively, and a portion of an upper surface of the channel layer C1 between the source electrode S1 and the drain electrode D1 may be exposed. The source electrode S1 and the drain electrode D1 may be a single metal layer or a multi-metal layer.

Referring to FIG. 6C, a passivation layer P1 may be formed on the gate insulating layer GI1 to cover the exposed portion of the channel layer C1 and the source and drain electrodes S1 and D1. The passivation layer P1 may have a multi-layer structure including a silicon oxide layer 10, a silicon oxynitride layer 20, and a silicon nitride layer 30, which are sequentially stacked on the gate insulating layer GI1. The silicon oxide layer 10 may be formed at a lower temperature of about 100° C. to about 250° C. or at a higher temperature of about 250° C. to about 450° C. When the silicon oxide layer 10 is formed at a higher temperature, the silicon oxide layer 10 may have a higher density than a case where the silicon oxide layer 10 is formed at a lower temperature. The silicon oxynitride layer 20 and the silicon nitride layer 30 may be formed at about 100° C. to about 250° C. but may also be formed at temperature that is higher than or equal to 250° C.

In more detail, the silicon oxide layer 10 may be formed using plasma-enhanced chemical vapor deposition (PECVD). In example embodiments, a pressure of a deposition chamber may be about 1 to about 4 torr, and a temperature of the deposition chamber may be about 100° C. to about 450° C., and a source power of the deposition chamber may be about 100 to about 400 W. Also, when the silicon oxide layer 10 is formed, a mixing gas including $SiH_4$ and $N_2O$, for example, may be used as a reaction gas. $SiH_4$ is a source gas of Si, and $N_2O$ is a source gas of O. In example embodiments, $SiH_4$ may be flowed at a rate of about 5 to about 40 sccm and $N_2O$ may be flowed at a rate of about 100 to about 5000 sccm.

The silicon oxynitride layer 20 may also be formed using PECVD. In example embodiments, the pressure of the deposition chamber may be about 1 to about 4 torr, a temperature of the deposition chamber may be about 100° C. to about 450° C., and a source power of the deposition chamber may be about 100 to about 400 W. A reaction gas for the silicon oxynitride layer 20 may include $SiH_4$, $N_2O$, and $NH_3$. $SiH_4$, $N_2O$, and $NH_3$ are source gases of Si, O, and N, respectively. $SiH_4$ may flow at a rate of about 5 to about 40 sccm, $N_2O$ may flow at a rate of about 100 to about 5000 sccm, and $NH_3$ may flow at a rate of about 10 to about 1000 sccm. The reaction gas of the silicon oxynitride layer 20 may further include $N_2$ and He as a carrier gas, for example. In example embodiments, $N_2$ may be flowed at a rate of about 100 to about 2000 sccm and He may be flowed at a rate of about 100 to about 2000 sccm.

The silicon nitride layer 30 may also be formed using PECVD. In example embodiments, the pressure of the deposition chamber may be about 1 to about 4 torr, a temperature of the deposition chamber may be about 100° C. to about 450° C., and a source power of the deposition chamber may be about 100 to about 400 W. A reaction gas for the silicon nitride layer 30 may include $SiH_4$ and $NH_3$, for example. $SiH_4$ and $NH_3$ are a source gas of Si and a source gas of N, respectively. $SiH_4$ may be flowed at a rate of about 5 to about 40 sccm and $NH_3$ may be flowed at a rate of about 10 to about 1000 sccm.

The reaction gas of the silicon nitride layer 30 may further include $N_2$ and He as a carrier gas, for example. In example embodiments, $N_2$ may flow at a rate of about 100 to about 2000 sccm and He may flow at a rate of about 100 to about 2000 sccm. Also, the reaction gas of the silicon nitride layer 30 may further include $N_2O$. Although $N_2O$ is the source gas of O, when a flow rate of $NH_3$ that is the source gas of N is higher than a case where the silicon oxynitride layer 20 is formed, $N_2O$ may not affect formation of a layer (e.g., the silicon nitride layer 30). $N_2O$ may be flowed at a rate of about 0 to about 5000 sccm.

The flow rate of $NH_3$ that is used to form the silicon oxynitride layer 20 may be lower than that of $NH_3$ that is used to form silicon nitride layer 30. Also, the silicon oxynitride layer 20 may be formed at a lower pressure than the silicon nitride layer 30. In addition, the silicon oxynitride layer 20 may or may not be formed using a lower source power than the silicon nitride layer 30. When the silicon oxynitride layer 20 is formed on a condition of the low flow rate of $NH_3$ and a low deposition pressure, hydrogen and/or plasma of the reaction gas used to form the silicon oxynitride layer 20 does not penetrate into the channel layer C1 via the silicon oxide layer 10 so that deterioration of the characteristics of the channel layer C1 may be prevented or reduced.

Also, the silicon oxynitride layer 20 may be used as the buffer layer (blocking layer) so that penetration of hydrogen and/or plasma of the reaction gas used to form the silicon nitride layer 30 may be efficiently prevented (or suppressed). Considering the function of the silicon oxynitride layer 20 as the buffer layer (or the blocking layer), the thickness of the silicon oxynitride layer 20 may be at least about 100 nm.

Before the passivation layer P1 is formed, the exposed portion of the channel layer C1 may be treated by using plasma including oxygen. Due to plasma treatment, oxygen may be supplied to the exposed portion of the channel layer C1, and the electrical conductivity of the channel layer C1 may be controlled. The transistor manufactured in this way may be annealed at a given temperature. Annealing may be performed in an air atmosphere or in an $N_2$ and $O_2$ atmosphere. Annealing may be performed at about 200° C. to 400° C. for about 1 to 100 hours.

Referring to FIG. 6C, before the source electrode S1 and the drain electrode D1 are formed, an etch stop layer (not shown) may also be formed on a top surface of the channel layer C1. In example embodiments, the structure of FIG. 2 may be obtained.

Figure 7A:
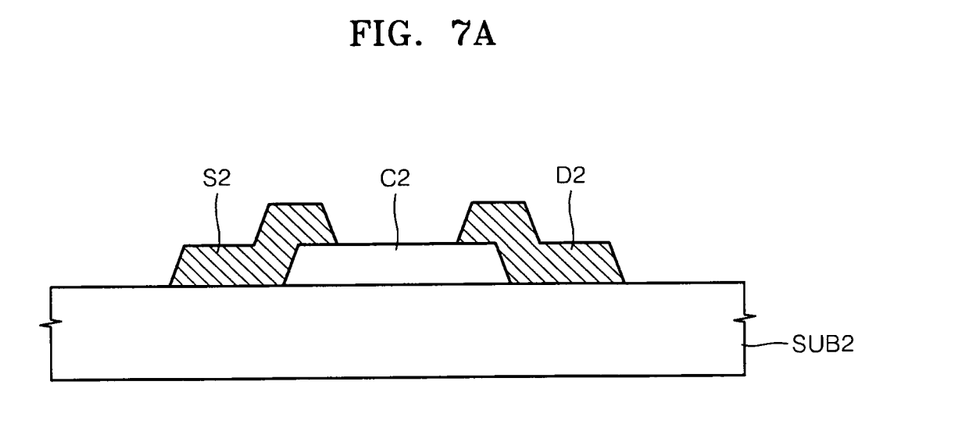
FIGS. 7A through 7C are cross-sectional views of a method of manufacturing a transistor, according to example embodiments.
Figure 7B:
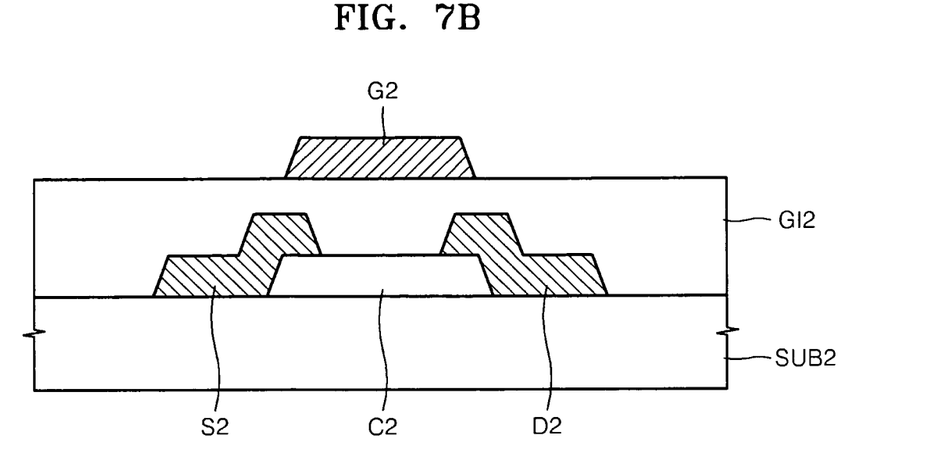
Figure 7C:
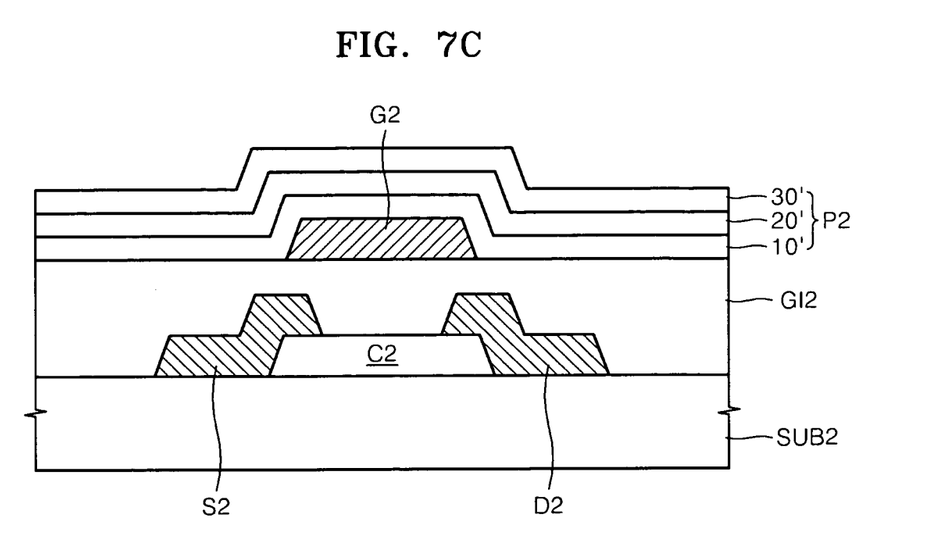

FIGS. 7A through 7C are cross-sectional views of a method of manufacturing a transistor, according to example embodiments. In example embodiments, a TFT having a top gate structure is manufactured. In FIG. 3 and FIGS. 7A through 7C, like reference numerals denote like elements.

Referring to FIG. 7A, a channel layer C2 may be formed on a substrate SUB2. The channel layer C2 may be formed of the same material as the channel layer C1 of FIG. 6B and may have the same structure as or a reverse structure of the channel layer C1 of FIG. 6B. A source electrode S2 and a drain electrode D2 may be formed on the substrate SUB2. The source electrode S2 and the drain electrode D2 may contact both ends of the channel layer C2, respectively. As occasion demands, an exposed portion of the channel layer C2 that is not covered by the source electrode S2 and the drain electrode D2 may be treated using plasma including oxygen.

Referring to FIG. 7B, a gate insulating layer GI2 may be formed on the substrate SUB2 to cover the exposed portion of the channel layer C2 and the source electrode S2 and the drain electrode D2. The gate insulating layer GI2 may be formed of the same material as the gate insulating layer GI1 of FIG. 6A and may have the same structure as or a reverse structure of the channel layer GI1 of FIG. 6A. A gate G2 may be formed on the gate insulating layer GI2. The gate G2 may be formed above the channel layer C2.

Referring to FIG. 7C, a passivation layer P2 may be formed on the gate insulating layer GI2 to cover the gate G2. The passivation layer P2 may be formed of the same material as the passivation layer P1 of FIG. 6C and may have the same stack structure as the passivation layer P1 of FIG. 6C. Reference numerals 10', 20', and 30' represent a silicon oxide layer, a silicon oxynitride layer, and a silicon nitride layer, respectively. The silicon oxide layer 10', the silicon oxynitride layer 20', and the silicon nitride layer 30' may be formed using the same method that is used to form the silicon oxide layer 10, the silicon oxynitride layer 20, and the silicon nitride layer 30 of FIG. 6C, respectively. The transistor manufactured in this way may be annealed at a given temperature. A condition for annealing may be the same as described with reference to FIG. 6C.

A transistor according to example embodiments may be used as a switching device or a driving device in flat display devices, e.g., liquid crystal display devices and organic light emitting display devices. As described above, the transistor according to example embodiments has relatively small characteristic variations due to light, and thus, the reliability of a flat display device including the transistor may be improved. The structures of liquid crystal display devices and organic light emitting display devices are well known, and thus, detailed descriptions thereof will be omitted. The transistor according to example embodiments may be used for various purposes in other electronic devices, e.g., memory devices and logic devices, as well as flat display devices.

It should be understood that example embodiments described herein should be considered in a descriptive sense only and not for purposes of limitation. For example, it will be understood by one of ordinary skill in the art that the components and the structures of the transistors illustrated in FIGS. 1 through 3 may be modified and changed. In detail, in the transistors of FIGS. 1 through 3, the source electrodes S1 and S2 and the drain electrodes D1 and D2 contact both ends of top surfaces of the channel layers C1 and C2, but the source electrodes S1 and S2 and the drain electrodes D1 and D2 may contact both ends of bottom surfaces of the channel layers C1 and C2. In other words, after the source electrodes S1 and S2 and the drain electrodes D1 and D2 are formed, the channel layers C1 and C2 that contact the source electrodes S1 and S2 and the drain electrodes D1 and D2 may be formed. Also, transistors according to example embodiments may have a double gate structure, and the passivation layers P1 and P2 may further include at least one additional material layer, for example, an organic insulating layer. The method of FIGS. 6A through 6C and the method of FIGS. 7A through 7C may be changed in various ways. Furthermore, it will be understood by one of ordinary skill in the art that the idea of example embodiments may be applied to various transistors as well as oxide thin film transistors. Descriptions of features or aspects within each example embodiment should typically be considered as available for other similar features or aspects in other example embodiments.

What is claimed is:

1. A transistor comprising:
a channel layer including an oxide;
a source electrode and a drain electrode configured to separately contact both ends of the channel layer, the source electrode covering a first region of the channel layer and the drain electrode covering a second region of the channel layer;
a gate corresponding to the channel layer;
a gate insulating layer between the channel layer and the gate, the gate insulating layer including a silicon nitride layer and a silicon oxide layer which are sequentially stacked from the gate; and
a passivation layer on the channel layer, the source and drain electrodes, the gate insulating layer, and the gate, the passivation layer including a silicon oxide layer, a silicon oxynitride layer, and a silicon nitride layer sequentially stacked,
wherein the silicon oxynitride layer includes oxygen through an entire thickness,
wherein a portion of the channel layer between the first region and the second region, which is not covered by the source electrode and the drain electrode, is a plasma-treated region that is treated with plasma including oxygen, and the portion of the channel layer includes oxygen provided by the plasma, and
wherein the portion of the channel layer between the first region and the second region has an oxygen concentration that is different from the oxygen concentration of a portion of the channel layer that is covered by the source electrode and the drain electrode.

2. The transistor of claim 1, wherein the channel layer includes a ZnO-based oxide.

3. The transistor of claim 2, wherein the ZnO-based oxide further includes indium (In).

4. The transistor of claim 3, wherein the ZnO-based oxide further includes at least one of the group consisting of hafnium (Hf), yttrium (Y), tantalum (Ta), zirconium (Zr), titanium (Ti), copper (Cu), nickel (Ni), gallium (Ga), aluminum (Al), tin (Sn), and magnesium (Mg).

5. The transistor of claim 4, wherein the ZnO-based oxide includes hafnium indium zinc oxide (HfInZnO).

6. The transistor of claim 1, wherein the silicon oxynitride layer has a thickness of about 100 nm to about 400 nm.

7. The transistor of claim 1, wherein the channel layer is on the gate.

8. The transistor of claim 7, further comprising:
an etch stop layer on the channel layer, wherein the source electrode and the drain electrode are on both ends of the etch stop layer.

9. The transistor of claim 1, wherein the gate is on the channel layer.

10. A flat display device comprising the transistor of claim 1.

11. A method of manufacturing a transistor, the method comprising:
  preparing a transistor including a channel layer, a source electrode and a drain electrode separately contacting both ends of the channel layer, a gate corresponding to the channel layer, and a gate insulating layer between the channel layer and the gate, the channel layer including an oxide and the gate insulating layer including a silicon nitride material layer and a silicon oxide material layer sequentially stacked from the gate, the source electrode covering a first region of the channel layer and the drain electrode covering a second region of the channel layer; and
  forming a passivation layer on the channel layer,
  wherein forming the passivation layer includes,
    forming a silicon oxide layer on the transistor,
    forming a silicon oxynitride layer on the silicon oxide layer, wherein the silicon oxynitride layer includes oxygen through an entire thickness, and
    forming a silicon nitride layer on the silicon oxynitride layer, and
  wherein a portion of the channel layer between the first region and the second region, which is not covered by the source electrode and the drain electrode, is a plasma-treated region treated with plasma including oxygen, and the portion of the channel layer includes oxygen provided by the plasma, and
  wherein the portion of the channel layer between the first region and the second region has an oxygen concentration that is different from the oxygen concentration of a portion of the channel layer that is covered by the source electrode and the drain electrode.

12. The method of claim 11, wherein at least one of the silicon oxide layer, the silicon oxynitride layer, and the silicon nitride layer is formed using plasma-enhanced chemical vapor deposition (PECVD).

13. The method of claim 11, wherein a first reaction gas including ammonia ($NH_3$) as a source gas of nitrogen (N) is used for forming the silicon oxynitride layer, and a second reaction gas including $NH_3$ as the source gas of N is used for forming the silicon nitride layer, and
  wherein a flow rate of $NH_3$ of the first reaction gas is lower than a flow rate of $NH_3$ of the second reaction gas.

14. The method of claim 11, wherein the silicon oxynitride layer is formed at a lower pressure than the silicon nitride layer.

15. The method of claim 11, wherein the silicon oxynitride layer is formed using a lower source power than the silicon nitride layer.

16. The method of claim 11, wherein the silicon oxynitride layer is formed to have a thickness of about 100 nm to about 400 nm.

17. The method of claim 11, wherein the channel layer includes a ZnO-based oxide.

18. The method of claim 17, wherein the ZnO-based oxide further includes indium (In).

19. The method of claim 18, wherein the ZnO-based oxide further includes at least one of the group consisting of Hf, Y, Ta, Zr, Ti, Cu, Ni, Ga, Al, Sn, and Mg.

20. The method of claim 19, wherein the ZnO-based oxide includes hafnium indium zinc oxide (HfInZnO).

21. The method of claim 11, wherein the transistor has at least one of a bottom gate structure and a top gate structure.

22. The method of claim 21, wherein the transistor has a bottom gate structure, further comprising:
  forming an etch stop layer on the channel layer, wherein the source electrode and the drain electrode are on both ends of the etch stop layer.

23. The method of claim 11, wherein prior to forming the passivation layer, further comprising:
  treating an exposed portion of the channel layer with plasma including oxygen.

24. A method of manufacturing a flat display device comprising the method of manufacturing a transistor according to claim 11.

25. A transistor comprising:
  a channel layer including an oxide;
  an etch stop layer on the channel layer;
  a source electrode and a drain electrode configured to separately contact both ends of the channel layer;
  a gate corresponding to the channel layer;
  a gate insulating layer between the channel layer and the gate, the gate insulating layer including a silicon nitride layer and a silicon oxide layer which are sequentially stacked from the gate; and
  a passivation layer covering the channel layer, the source and drain electrodes, the gate insulating layer, and the gate, the passivation layer including a silicon oxide layer, a silicon oxynitride layer, and a silicon nitride layer sequentially stacked,
  wherein the silicon oxynitride layer includes oxygen through an entire thickness,
  wherein the channel layer is above the gate, the source electrode and the drain electrode are on both ends of the etch stop layer, the source electrode covers an upper surface of a first end of the etch stop layer, and the drain electrode covers an upper surface of a second end of the etch stop layer,
  wherein a portion of the channel layer between the first region and the second region, which is not covered by the source electrode and the drain electrode, is a plasma-treated region that is treated with plasma including oxygen, and the portion of the channel layer includes oxygen provided by the plasma, and
  wherein the portion of the channel layer between the first region and the second region has an oxygen concentration that is different from the oxygen concentration of a portion of the channel layer that is covered by the source electrode and the drain electrode.

* * * * *